United States Patent
Hsieh et al.

(10) Patent No.: US 9,934,828 B2
(45) Date of Patent: Apr. 3, 2018

(54) SHARED SENSE AMPLIFIER AND WRITE DRIVER

(71) Applicant: Taiwan Semiconductor Manufacturing Company Limited, Hsinchu (TW)

(72) Inventors: Chi-Kai Hsieh, Taoyuan County (TW); Cheng Hung Lee, Hsinhu (TW); Fu-An Wu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/414,818

(22) Filed: Jan. 25, 2017

(65) Prior Publication Data

US 2017/0345465 A1    Nov. 30, 2017

Related U.S. Application Data

(60) Provisional application No. 62/343,243, filed on May 31, 2016.

(51) Int. Cl.
  *G11C 7/22*   (2006.01)
  *G11C 7/08*   (2006.01)
  *G11C 7/12*   (2006.01)

(52) U.S. Cl.
  CPC . *G11C 7/08* (2013.01); *G11C 7/12* (2013.01)

(58) Field of Classification Search
  CPC ....... G11C 7/1048; G11C 7/12; G11C 11/419; G11C 7/1039
  USPC ....................................................... 365/189.14
  See application file for complete search history.

(56) References Cited

U.S. PATENT DOCUMENTS

| | | | | |
|---|---|---|---|---|
| 6,549,994 | B1 * | 4/2003 | Noh ..................... | G11C 7/1039 711/168 |
| 8,208,328 | B2 * | 6/2012 | Hong ................... | G11C 7/1048 365/189.11 |
| 2011/0026314 | A1 * | 2/2011 | Hamouche ............... | G11C 7/12 365/156 |
| 2013/0094307 | A1 * | 4/2013 | Cheng ................... | G11C 11/419 365/191 |

* cited by examiner

*Primary Examiner* — Hoai V Ho
*Assistant Examiner* — Minh Dinh
(74) *Attorney, Agent, or Firm* — Jones Day

(57) ABSTRACT

Systems and methods are provided for a sense amplifier/write driver circuit. A system includes a set of transistors responsive to a memory cell, the set of transistors configured to operate as a sense amplifier in a first mode and to operate as a write driver in a second mode. One or more switches are configured to switch the set of transistors from the first mode to the second mode based on a control signal. Particular transistors of the set of transistors are configured by the one or more switches to amplify and retain data at a pair of input/output nodes for a period of time in the first mode. The particular transistors are further configured by the one or more switches to drive data to the pair of input/output nodes in the second mode.

20 Claims, 5 Drawing Sheets

SHARED SENSE AMPLIFIER AND WRITE DRIVER

CROSS-REFERENCE TO RELATED APPLICATIONS

This application claims priority to U.S. Provisional Patent Application No. 62/343,243, filed May 31, 2016, entitled "Shared Sense Amplifier and Write Driver," the entirety of which is herein incorporated by reference.

BACKGROUND

In high speed memory designs, large sense amplifiers are typically utilized to provide smaller mismatch, and separate, large write drivers are typically used to provide desirable write margins. While these designs have some wanted characteristics, they are also susceptible to leakage currents and to being larger in area than desirable.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
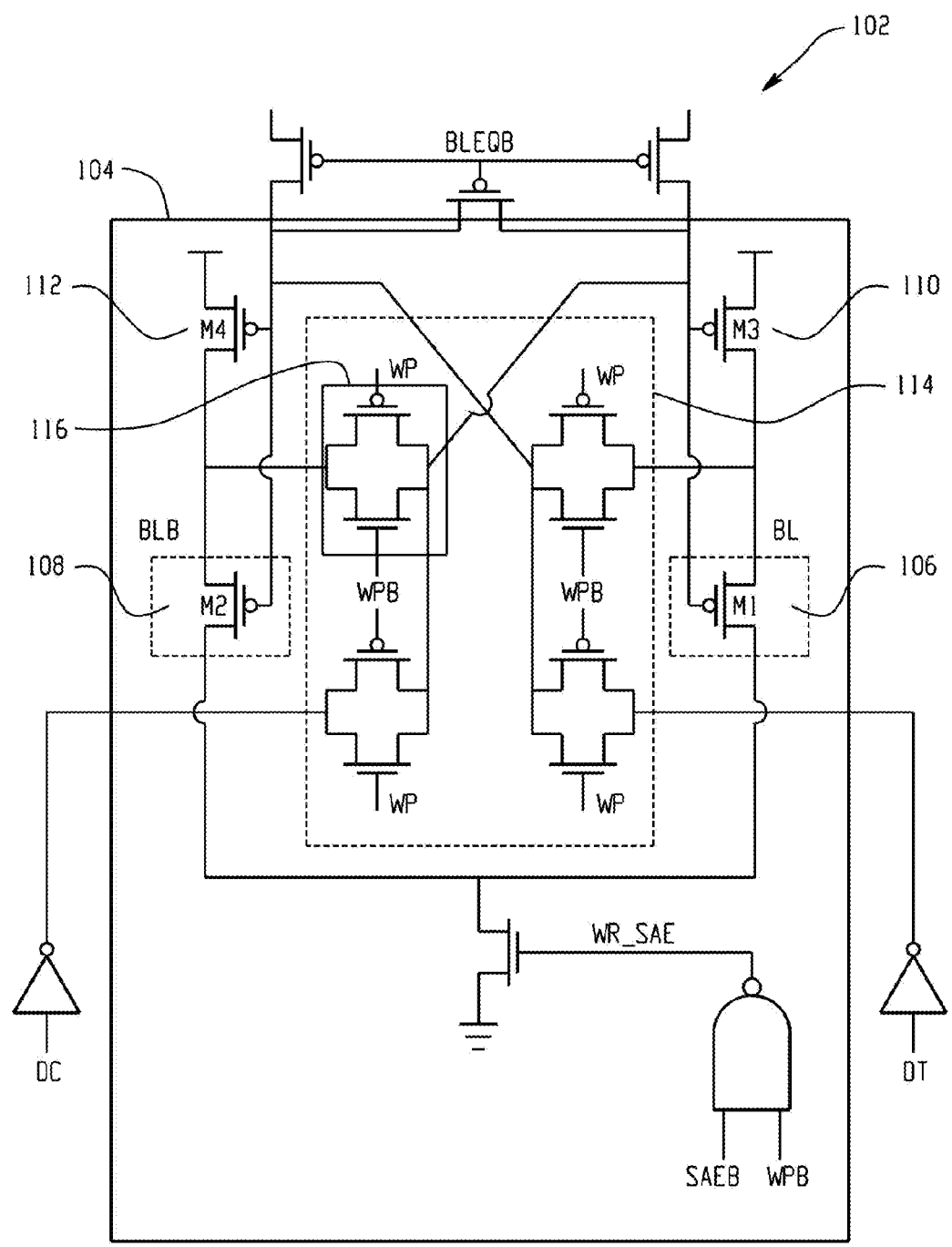
FIG. 1 is a diagram depicting an example combined sense amplifier/write driver in one embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Systems and methods as described herein in some embodiments disclose combined sense amplifiers and write drivers that can be implemented in a reduced area compared to designs having separate sense amplifiers and write drivers. Additionally, certain embodiments of the present disclosure can provide sense amplifier/write driver circuits that are not susceptible to leakage currents that often plague conventional devices.

FIG. 1 is a diagram depicting an example combined sense amplifier/write driver in one embodiment of the disclosure. The example 102 of FIG. 1 includes a sense amplifier/write driver 104 that is configured to read data from and write data to a memory cell (not shown) via input/output nodes BL and BLB, depending on its mode of operation. In a read mode of operation, data from the memory cell is applied to input/output nodes BL and BLB and is amplified and retained at those nodes for a period of time via a set of transistors 106, 108, 110, 112. That set of transistors is configured via a set of switches, indicated collectively as 114, to operate as a cross-coupled pair of inverters during a read operation to hold the data at BL/BLB. In a write operation, that same set of transistors 106, 108, 110, 112 are configured via the set of switches 114 to operate as a pair of inverters that drive data from inputs DT and DC to the input/output nodes BL and BLB and subsequently to the memory cell (not shown).

Specifically, the combined sense amplifier/write driver 104 includes a set of four transistors 106, 108, 110, 112 labeled as first transistor M1, second transistor M2, third transistor M3, and fourth transistor M4. In the example of FIG. 1, those four transistors 106, 108, 110, 112 operate in both a read mode and a write mode to interact with the memory cell (not shown) through BL/BLB. In addition to the set of transistors 106, 108, 110, 112, the combined sense amplifier/write driver 104 includes a set of switches 114 that are configured to switch the set of transistors 106, 108, 110, 112 from a first, read mode to a second, write mode. In the example of FIG. 1, one of the four switches is indicated at 116. The four switches (e.g., switch 116) each include a pair of transistors that are connected at source and drain nodes. Each pair of transistors in one of the switches (e.g., switch 116) of the set 114 includes one PMOS transistor and one NMOS transistor. Those transistors are controlled at their gates by a control signal labeled WP and its complement labeled WPB. Those control signals WP/WPB switch the sense amplifier/write driver circuit 104 between the read mode and the write mode. Specifically, in the example of FIG. 1, low WPB control signal and a high WP control signal will turn switches SW0 118 and SW1 120 on and switches SW2 126 and SW3 128 off. This occurs by providing proper gate voltages at both transistors of the pair of transistors at a switch to allow current to flow through both transistors of the switch (i.e., a high level at the NMOS transistor and a low level at the PMOS transistor). Alternatively, a high WPB control signal and a low WP control signal will turn switches SW2 126 and SW3 128 on, while turning switches SW0 118 and SW1 120 off.

Figure 2:
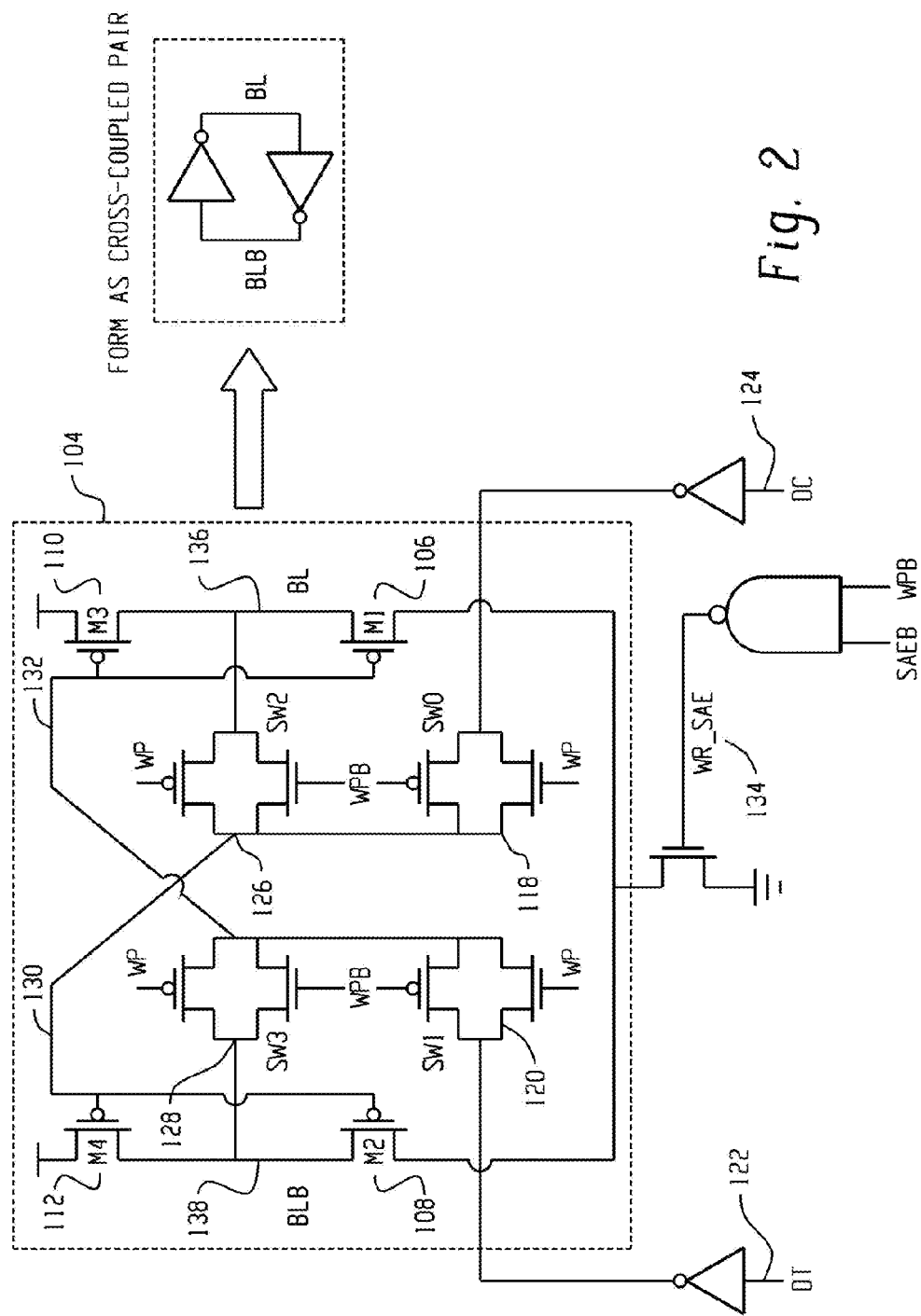
FIG. 2 is a diagram depicting details of a combined sense amplifier/write driver operating in a read mode in one embodiment of the disclosure.

FIG. 2 is a diagram depicting details of a combined sense amplifier/write driver 104 operating in a read mode in one embodiment of the disclosure. In the example of FIG. 2, the control signals, WP and WPB, are asserted to place the four transistors 106, 108, 110, 112 in the proper configuration for the read mode. Specifically, the WPB control signal is set at a high state, and the WP control signal is set at a low state. This control signal state turns switches SW0 118 and SW1 120 off. This off state at SW0 118 and SW1 120 blocks any signals coming from the lines labeled DT 122 and DC 124, which are the source points for writing data to the memory cell (not pictured in FIG. 2).

A high WPB control signal and low WP control signal correspondingly turns switches SW2 126 and SW3 128 on. This configuration effectively places the set of transistors M1-M4 106, 108, 110, 112 into a state where they operate as a cross-coupled pair of invertors. Data signals from the memory cell (not shown) are received at the nodes labeled 136 and 138. The cross-coupled pair configuration of the set of transistors 106, 108, 110, 112 retains that read data in an amplified state at BL/BLB until it is ready to be output from the circuit 104.

Specifically, a data signal present at node 130 traverses switch SW2 126, which is on, such that its level is retained at node BL 136, from which data can be read as described further herein. That data signal at 130 further controls the gates of PMOS transistor M4 112 and NMOS transistor M2 108, which enables amplification of the data signal present at node 132 at node BLB 138. That data signal present at node 132 similarly traverses switch SW3 128, which is on, such that its level is retained at node BL 138, from which it can be read as described further below. That data signal at 132 further controls the gates of PMOS transistor M3 110 and NMOS transistor M1 106, enabling amplification of the data signal present at node 130, as described earlier. The circuit 104 thus performs sensing of data signals present at nodes 130, 132, amplifies those signals in returning that data to nodes BL 136 and BLB 138, and retains them until they are read. When the sense amplifier enable (SAE) signal indicated at 134 transitions, the amplified data from the memory cell (not shown) present at the nodes labeled BL 136 and BLB 138 is read out from the circuit 104.

Figure 3:
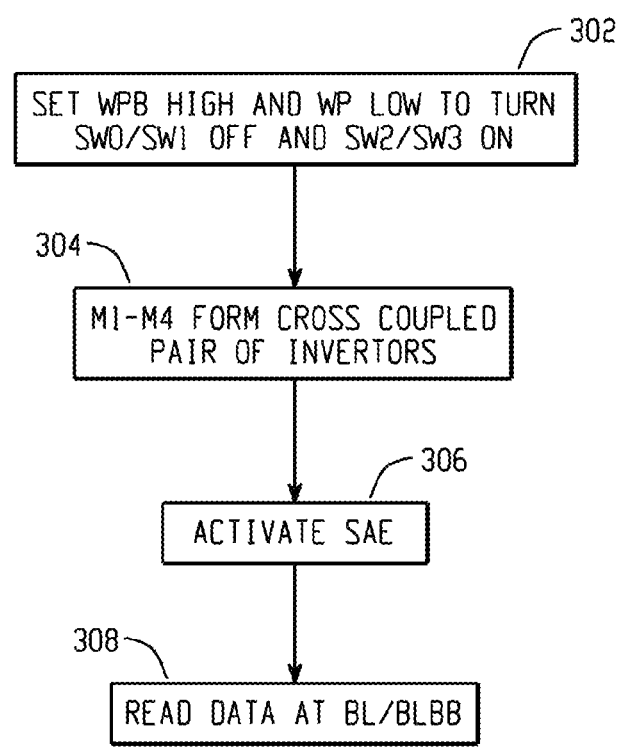
FIG. 3 is a flow diagram depicting steps and events of operating a combined sense amplifier/write driver in a read mode one embodiment of the disclosure.

FIG. 3 is a flow diagram depicting steps and events of operating a combined sense amplifier/write driver in a read mode in one embodiment of the disclosure. The steps of FIG. 3 can be viewed with reference to FIG. 2, but they are equally applicable to other hardware configurations. At 302, control signal WPB is set high, and control signal WP is set low. This turns switches SW0 118 and SW1 120 off and switches SW2 126 and SW3 128 on. As indicated at 304, operating the switches in this fashion results in the set of transistors M1-M4 106, 108, 110, 112 effectively forming a cross coupled pair of invertors. Data from the memory cell is sensed, amplified, and is retained in the cross coupled pair of invertors. At 306, the SAE signal 134 is activated, and at 308 data is read from the bit lines, BL 136 and BLB 138.

Figure 4:
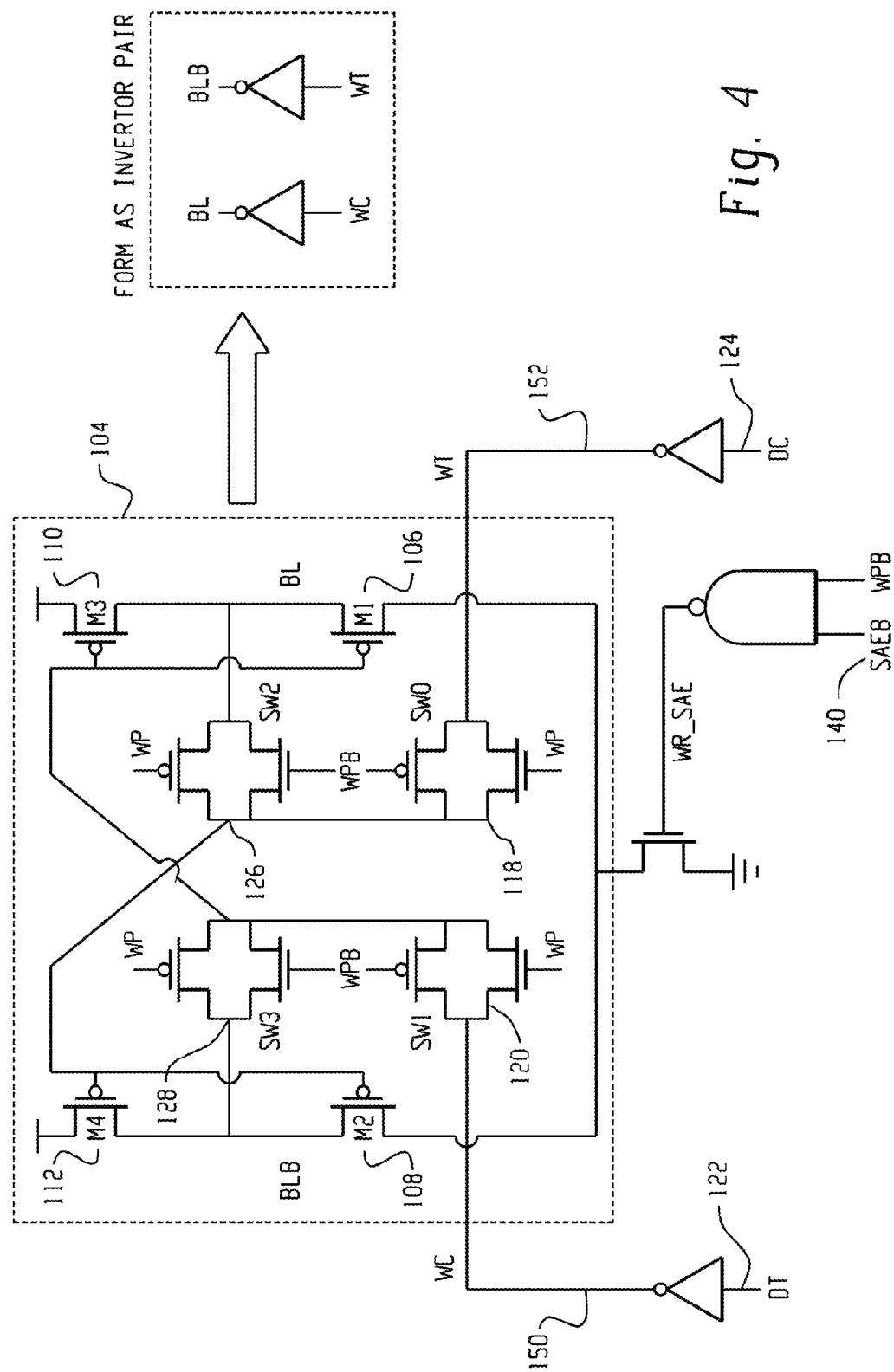
FIG. 4 is a diagram depicting details of a combined sense amplifier/write driver operating in a write mode in one embodiment of the disclosure.

FIG. 4 is a diagram depicting details of a combined sense amplifier/write driver 104 operating in a write mode in one embodiment of the disclosure. In the write mode, control signal WPB is initially set to a low state while control signal WP is set to a high state, while SAEB 140 is held at a high state. This switch operation turns switches SW0 118 and SW1 120 on and turns switches SW2 126 and SW3 128 off. Such switch states transition the four transistors M1-M4 106, 108, 110, 112 into a state where they operate as two independent invertors. Transistors M1 106 and M3 110 operate as one invertor and transistors M2 108 and M4 112 operate as a second invertor that are responsive to data received at nodes WC 150 and WT 152 from the DT 122 and DC 124 write data inputs. DT 122 and DC 124 are at their respective data levels. When control signals WPB and WP transition, the invertor pairs formed by the four transistors M1-M4 106, 108, 110, 112 output data to the memory cell via nodes BL/BLB.

Specifically, a data signal present at node WT 152 traverses switch SW0 118, where it controls the gates of PMOS transistor M4 112 and NMOS transistor M2 108. This gate control of transistors M4 112 and M2 108 acts as an invertor, as depicted at 154, where the inverse of the signal presented at node WT 152 is present at node BLB 138 prior to triggering of a write operation. An invertor 158 present in the path from node DC 124 to node WT 152 makes the signal at node BLB 138 equivalent to the input data signal presented at DC 124. Similarly, on the other side of the sense amplifier/write driver circuit 104 operating in the write mode, a data signal present at node WC 150 traverses switch SW1 120, where it controls the gates of PMOS transistor M3 110 and NMOS transistor M1 106. This gate control of transistors M3 110 and M1 106 acts as an invertor, as depicted at 156, where the inverse of the signal presented at node WC 150 is present at node BL 136 prior to triggering of a write operation. An invertor 160 present in the path from node DT 122 to node WC 150 makes the signal at node BL 136 equivalent to the input data signal presented at DT 122. When control signals WPB and WP transition, the invertor pairs formed by the four transistors M1-M4 106, 108, 110, 112 output data to the memory cell via nodes BL/BLB.

Figures 5, 6:
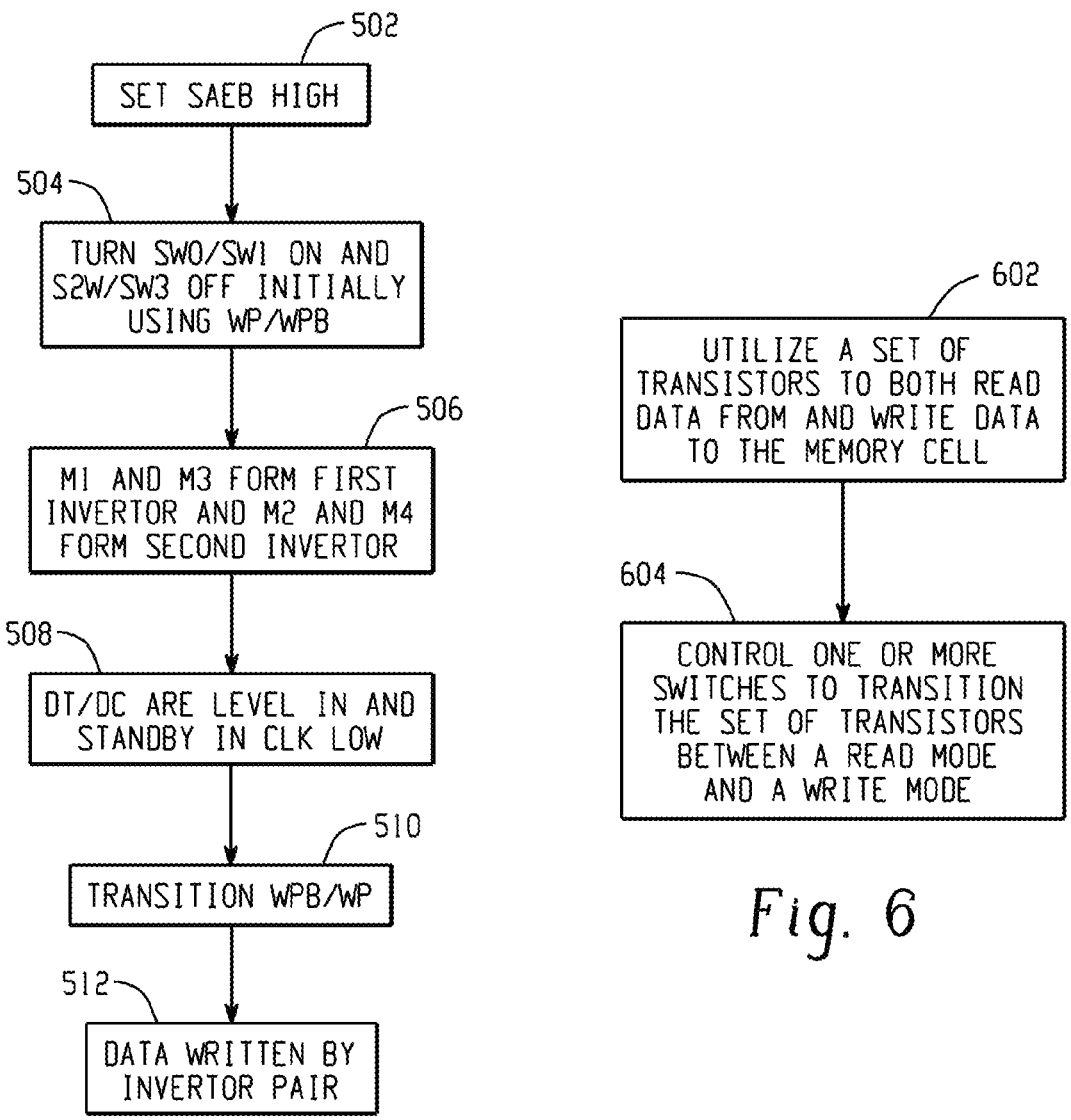
FIG. 5 is a flow diagram depicting steps and events of operating a combined sense amplifier/write driver in a write mode in one embodiment of the disclosure.
FIG. 6 is a flow diagram depicting an example method of controlling reading data from and writing data to a memory cell.

FIG. 5 is a flow diagram depicting steps and events of operating a combined sense amplifier/write driver in a write mode in one embodiment of the disclosure. The steps of FIG. 5 can be viewed with reference to FIG. 4, but they are equally applicable to other hardware configurations. At 502, SAEB 140 is set to a high state, and at 504, switches SW0 118 and SW1 120 are turned on, with switches SW2 126 and SW3 128 being turned off using the WP and WPB control signals. As indicated at 506, such switch operation will place transistors M1 106 and M3 110 into a state where they operate as a first invertor while transistors M2 108 and M4 112 similarly are configured to operate as a second invertor. At 508, data input nodes DT 122 and DC 124 are level in and standby is in CLK low. At 510, the WPB and WP control signals are transitioned (e.g., fired), which results in the invertor pairs formed by the set of four transistors 106, 108, 110, 112 writing data to the memory cell, as noted at 512.

FIG. 6 is a flow diagram depicting an example method of controlling reading data from and writing data to a memory cell. The steps of FIG. 6 can be viewed with reference to FIG. 4, but they are equally applicable to other hardware configurations. In the example, at 602, a set of transistors 106, 108, 110, 112 responsive to a memory cell is utilized to both read data from and write data to the memory cell, the transistors of the set of transistors 106, 108, 110, 112 being active in both reading and writing data. At 604, one or more switches 118, 120, 126, 128 are controlled to transition the set of transistors between a read mode and a write mode.

Example embodiments as described herein can provide a number of benefits over conventional implementations. In one example, a combined sense amplifier/write driver can be implemented at 132 fin, with the write driver utilizing 30 fin and the sense amplifier also using 30 fin. This sizing, in some instances, is similar or smaller than conventional, separate sense amplifier-write driver arrangements. Such a circuit is can be implemented without any write driver leakage (e.g., through shared use of NMOS transistors in the set of shared transistors), where comparably sized conventional circuits suffer from leakage currents. In certain examples, a combined sense amplifier/write driver provides a large write driver in a push-pull configuration that provides a strong write margin while sharing certain transistors with a sense amplifier operation.

The present disclosure is directed to systems and methods are provided for a sense amplifier/write driver circuit. A system includes a set of transistors responsive to a memory cell, the set of transistors configured to operate as a sense amplifier in a first mode and to operate as a write driver in a second mode. One or more switches are configured to switch the set of transistors from the first mode to the second mode based on a control signal. Particular transistors of the set of transistors are configured by the one or more switches to amplify and retain data at a pair of input/output nodes for a period of time in the first mode. The particular transistors are further configured by the one or more switches to drive data to the pair of input/output nodes in the second mode.

In an example method of controlling reading data from and writing data to a memory cell, a set of transistors responsive to a memory cell is used to both read data from and write data to the memory cell, the transistors of the set of transistors being active in both reading and writing data. One or more switches are controlled to transition the set of transistors between a read mode and a write mode. Particular transistors of the set of transistors being controlled by the one or more switches to amplify and retain data at a pair of input/output nodes for a period of time in the read mode. The particular transistors further being controlled by the one or more switches to drive data to the pair of input/output nodes in the write mode.

In another example, a memory includes a memory cell. A sense amplifier/write driver circuit includes a set of transistors responsive to a memory cell, the set of transistors configured to operate as a sense amplifier in a first mode and to operate as a write driver in a second mode; and one or more switches that are configured to switch the set of transistors from the first mode to the second mode based on a control signal. Particular transistors of the set of transistors are configured by the one or more switches to amplify and retain data at a pair of input/output nodes for a period of time in the first mode. The particular transistors are further configured by the one or more switches to drive data to the pair of input/output nodes in the second mode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sense amplifier/write driver circuit, comprising:
a set of transistors responsive to a memory cell, the set of transistors configured to operate as a sense amplifier in a first mode and to operate as a write driver in a second mode;
one or more switches configured to switch the set of transistors from the first mode to the second mode based on a control signal;
particular transistors of the set of transistors being configured by the one or more switches to amplify and retain data at a pair of input/output nodes for a period of time in the first mode, wherein, in the first mode, the set of transistors form a cross-coupled pair of invertors; and
the particular transistors further being configured by the one or more switches to drive data to the pair of input/output nodes in the second mode, wherein, in the second mode, the set of transistors form a pair of invertors.

2. The circuit of claim 1, wherein the first mode is a read mode;
wherein, in the first mode, the output of a first invertor in the cross coupled pair of invertors and the input of a second invertor in the cross coupled pair of invertors are connected to a first bit line, and the input of a first invertor in the cross coupled pair of invertors and the output of a second invertor in the cross coupled pair of invertors are connected to a second bit line.

3. The circuit of claim 2, wherein data from the memory cell is transmitted to the input/output nodes;
wherein, upon activation of an enable signal, the data is transmitted from the input/output nodes.

4. The circuit of claim 1, wherein the second mode is a write mode;
wherein, in the second mode, the input to a first invertor in the pair of invertors is a first inverted write data input, the output of the first invertor is a first bit line, the input to a second invertor in the pair of invertors is a second inverted write data input, and the output of the second invertor is a second bit line.

5. The circuit of claim 4, wherein, upon activation of the control signal, each invertor of the pair of invertors writes data to the memory cell.

6. The circuit of claim 1, wherein the set of transistors include four transistors;
wherein, in the first mode, a first and a second transistor of the four transistors operate as a first invertor of a pair of cross coupled invertors; and
wherein a third and fourth transistor of the four transistors operate as a second invertor of the pair of cross coupled invertors.

7. The circuit of claim 6, wherein, in the second mode, the first and the third transistor form a first invertor of an invertor pair; and
wherein the second and the fourth transistor form a second invertor of the invertor pair.

8. The circuit of claim 1, wherein the one or more switches comprise four switches;
wherein each of the four switches comprise two transistors connected at source and drain nodes, wherein the two transistors of each switch include one NMOS transistor and one PMOS transistor.

9. The circuit of claim 8, wherein each of the transistors of the four switches is gate-controlled by the control signal or a complement of the control signal.

10. A method of controlling reading data from and writing data to a memory cell, comprising:
utilizing a set of transistors responsive to a memory cell to both read data from and write data to the memory cell, the transistors of the set of transistors being active in both reading and writing data;
controlling one or more switches to transition the set of transistors between a read mode and a write mode;
wherein controlling the one or more switches includes:
controlling particular transistors of the set of transistors to amplify and retain data at a pair of input/output nodes for a period of time in the read mode, wherein, in the read mode, controlling the switches transitions the set of transistors to form a cross-coupled pair of invertors; and
controlling the particular transistors to drive data to the pair of input/output nodes in the write mode, wherein, in the write mode, controlling the switches transitions the set of transistors to form a pair of invertors that are configured to write data to the memory cells.

11. The method of claim 10, wherein, in the read mode, the output of a first invertor in the cross coupled pair of invertors and the input of a second invertor in the cross coupled pair of invertors are connected to a first bit line, and the input of a first invertor in the cross coupled pair of invertors and the output of a second invertor in the cross coupled pair of invertors are connected to a second bit line.

12. The method of claim 10, wherein, in the write mode, the input to a first invertor in the pair of invertors is a first inverted write data input, the output of the first invertor is a first bit line, the input to a second invertor in the pair of invertors is a second inverted write data input, and the output of the second invertor is a second bit line.

13. The method of claim 10, wherein controlling the one or more switches comprises controlling a set of four switches;
wherein each of the four switches comprise two transistors connected at source and drain nodes, wherein the two transistors of each switch include one NMOS transistor and one PMOS transistor.

14. The method of claim 13, wherein each of the transistors of the four switches is gate-controlled by a control signal or a complement of the control signal.

15. The method of claim 10, wherein utilizing the set of transistors includes utilizing four transistors in the set of transistors.

16. A memory, comprising:
a memory cell; and
a sense amplifier/write driver circuit comprising:
a set of transistors responsive to a memory cell, the set of transistors configured to operate as a sense amplifier in a first mode and to operate as a write driver in a second mode;
one or more switches configured to switch the set of transistors from the first mode to the second mode based on a control signal;
particular transistors of the set of transistors being configured by the one or more switches to perform a sense amplifier operation in the first mode and to perform a write driver operation in the second mode,
wherein, in the first mode, the set of transistors form a cross-coupled pair of invertors, and wherein, in the second mode, the set of transistors form a pair of invertors.

17. The memory of claim 16, wherein the first mode is a read mode;
wherein, in the first mode, the output of a first invertor in the cross coupled pair of invertors and the input of a second invertor in the cross coupled pair of invertors are connected to a first bit line, and the input of a first invertor in the cross coupled pair of invertors and the output of a second invertor in the cross coupled pair of invertors are connected to a second bit line.

18. The memory of claim 17, wherein data from the memory cell is transmitted to the input/output nodes;
wherein, upon activation of an enable signal, the data is transmitted from the input/output nodes.

19. The memory of claim 16, wherein the second mode is a write mode;
wherein, in the second mode, the input to a first invertor in the pair of invertors is a first inverted write data input, the output of the first invertor is a first bit line, the input to a second invertor in the pair of invertors is a second inverted write data input, and the output of the second invertor is a second bit line.

20. The memory of claim 19, wherein, upon activation of the control signal, each invertor of the pair of invertors writes data to the memory cell.

* * * * *